(12) United States Patent
Michael et al.

(10) Patent No.: US 7,465,600 B2
(45) Date of Patent: Dec. 16, 2008

(54) PACKAGE FOR A MICRO-ELECTRO MECHANICAL DEVICE

(75) Inventors: Don Michael, Monmoth, OR (US); Mari J. Rossman, Corvallis, OR (US); Bradley Bower, Junction City, OR (US); Charles Craig Haluzak, Corvallis, OR (US); John R. Stemer, Albany, OR (US); Quan Qi, Corvallis, OR (US); John Kane, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 676 days.

(21) Appl. No.: 10/775,517

(22) Filed: Feb. 9, 2004

(65) Prior Publication Data

US 2005/0173769 A1    Aug. 11, 2005

(51) Int. Cl.
*H01L 23/20* (2006.01)
*H01L 21/00* (2006.01)

(52) U.S. Cl. .................... 438/51; 438/106; 257/682; 257/E23.095

(58) Field of Classification Search .................. 438/51, 438/106; 257/682, 687, 730, E23.095, E23.139
See application file for complete search history.

(56) References Cited

U.S. PATENT DOCUMENTS

| | | | | |
|---|---|---|---|---|
| 4,357,557 | A * | 11/1982 | Inohara et al. | 313/509 |
| 4,810,931 | A * | 3/1989 | McKenna et al. | 313/509 |
| 6,479,320 | B1 | 11/2002 | Gooch | |
| 6,603,182 | B1 | 8/2003 | Low et al. | |
| 6,621,137 | B1 | 9/2003 | Ma et al. | |
| 6,858,466 | B1 * | 2/2005 | Bower et al. | 438/106 |
| 6,930,367 | B2 * | 8/2005 | Lutz et al. | 257/417 |
| 6,936,494 | B2 * | 8/2005 | Cheung | 438/55 |
| 2002/0000649 | A1 * | 1/2002 | Tilmans et al. | 257/678 |
| 2002/0106862 | A1 * | 8/2002 | Jordan et al. | 438/406 |
| 2003/0183916 | A1 * | 10/2003 | Heck et al. | 257/684 |
| 2004/0011699 | A1 * | 1/2004 | Park | 206/710 |
| 2005/0089283 | A1 * | 4/2005 | Michael et al. | 385/94 |

* cited by examiner

*Primary Examiner*—Douglas M Menz
*Assistant Examiner*—Steven J. Fulk (57) ABSTRACT

A package for a micro-electromechanical device (MEMS package) includes an inner enclosure having an inner cavity defined therein, and a fill port channel communicating with the inner cavity and of sufficient length to allow a quantity of adhesive to enter the fill port channel while preventing the adhesive from entering the inner cavity.

25 Claims, 10 Drawing Sheets

PACKAGE FOR A MICRO-ELECTRO MECHANICAL DEVICE

BACKGROUND

As integrated circuit (IC) geometries continue to decrease, and with the advent of Micro-Electro Mechanical Systems (MEMS), the need for reliable, high density packaging solutions increases. A promising solution for providing reliable packaging for chips of continually decreasing size is Wafer Level Packaging (WLP). WLP is a packaging method in which packaging is formed at the wafer level in an IC foundry or other processing location, allowing testing and burn-in to be performed before the dicing of individual chips.

In certain wafer level packaging (WLP) methods, small cavities or enclosures of an IC or MEMS package may be filled with fluid. In many such applications, fluid filling in a WLP may need to be performed in such a way as to prevent bubbles or gaseous pockets from forming in the fluid filled cavities.

Fluid packaging may perform a number of functions essential for an IC or MEMS device. Packaging may provide electrical connection, electrical isolation, or passivation from moisture and electrolytes, physical isolation from the environment to provide structural integrity of mechanical devices, thermal and optical protection to prevent undesirable performance changes, and chemical isolation to protect from harsh chemical environments. Electrical connection and isolation may include providing electrical connections from the outside of the MEMS package to electrical or mechanical components of the MEMS device inside the package, electrostatic shielding of the MEMS device, and preventing penetration of moisture and subsequent corrosion of electrical components or undesired interface adhesion.

The fluid is often introduced to the MEMS package by way of a fill port. In order to maximize the protections previously described, the fill ports may be sealed. The process of sealing the fill port is subject to many different variables that can occur during processing. These variables include temperature drift, time at temperature, and fluid properties such as viscosity. These process variations may cause the adhesive to be drawn into the MEMS packaging and onto the MEMS device itself. The presence of adhesive on the MEMS may render the MEMS device inoperable.

SUMMARY

A package for a micro-electromechanical device (MEMS package) includes an inner enclosure having an inner cavity defined therein, and a fill port channel communicating with the inner cavity and of sufficient length to allow a quantity of adhesive to enter the fill port channel while preventing the adhesive from entering the inner cavity.

BRIEF DESCRIPTION OF THE DRAWINGS

The accompanying drawings illustrate various embodiments of the present system and method and are a part of the specification. The illustrated embodiments are merely examples of the present system and method for creating a hermetic seal and do not limit the scope thereof. The summary and other features and aspects of the present system and method will become further apparent upon reading the following detailed description and upon reference to the drawings in which.

Throughout the drawings, identical reference numbers designate similar, but not necessarily identical, elements.

DETAILED DESCRIPTION

A package for a micro-electromechanical device (MEMS package) described herein includes an inner enclosure having an inner cavity defined therein, and a fill port channel communicating with the inner cavity and of sufficient length to allow a quantity of adhesive to enter the fill port channel while preventing the adhesive from entering the inner cavity. This fluid may include filling or packaging fluid as well as liquid adhesive.

As used in this specification and in the appended claims, the term "Micro-Electro Mechanical System" or "MEMS" is meant to be understood broadly as describing any very small (micro) mechanical device that may be constructed on a single semiconductor chip and which may be fabricated using integrated circuit (IC) batch-processing techniques. MEMS may be broadly classified as sensors, actuators, a combination of sensors and actuators, or added circuitry for processing or control.

Additionally, a MEMS device may include an optical component, making it a micro-electro-optical mechanical system or MEOMS. For the purposes of the present specification and appended claims, the term MEMS is meant to refer to any of the above-mentioned devices, including MEMS or any other micro-electro-optical mechanical system (MEOMS). The term "package" or "packaging" is meant to be understood as any enclosure or support for a MEMS device providing electrical connection or isolation, and mechanical, thermal, chemical, or optical isolation or passivation in order to protect the functioning and prolong the life of the MEMS.

A "fill port" is meant to be understood as any opening in a MEMS package that may be used to evacuate the MEMS package of, or fill the MEMS package with, a fluid (liquid or gas). Similarly, a seal is meant to be understood as any material configured to function as a seal, either temporarily or permanently, over a fill port. A choke point is meant to be understood as any structure that includes a relatively narrow section.

In the following specification, for purposes of explanation, numerous specific details are set forth in order to provide a thorough understanding of the present system and method for creating a MEMS package having a flow control structure with locking features. It will be apparent, however, to one skilled in the art, that the present method may also be practiced on any MEMS package either with or without these specific details. Reference in the specification to "one embodiment" or "an embodiment" means that a particular feature, structure, or characteristic described in connection with the embodiment is included in at least one embodiment. The appearance of the phrase "in one embodiment" in various places in the specification are not necessarily all referring to the same embodiment.

Exemplary Structure

Figure 1:
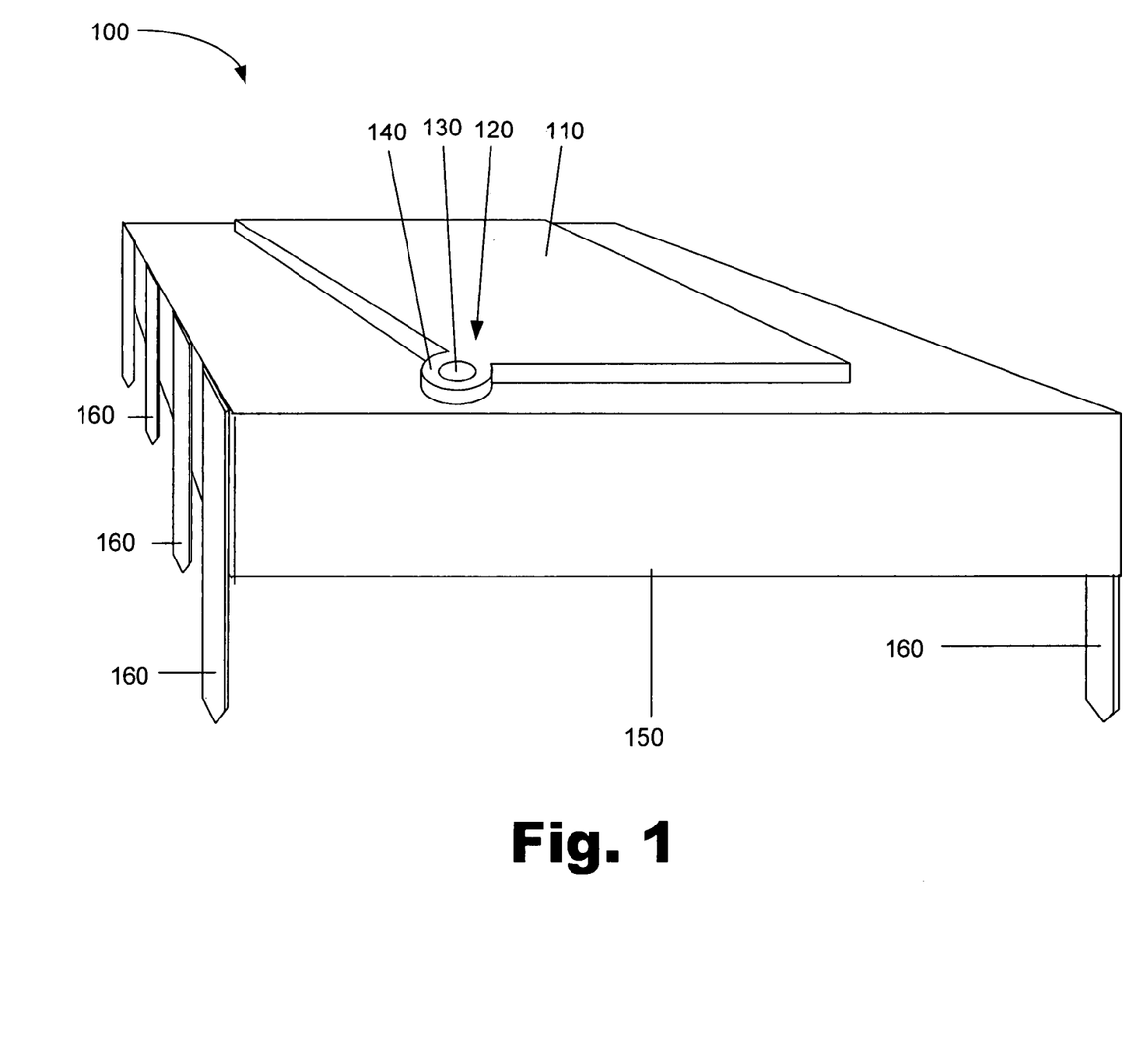
FIG. 1 is a perspective view of a MEMS package according to one exemplary embodiment.
Figure 2:
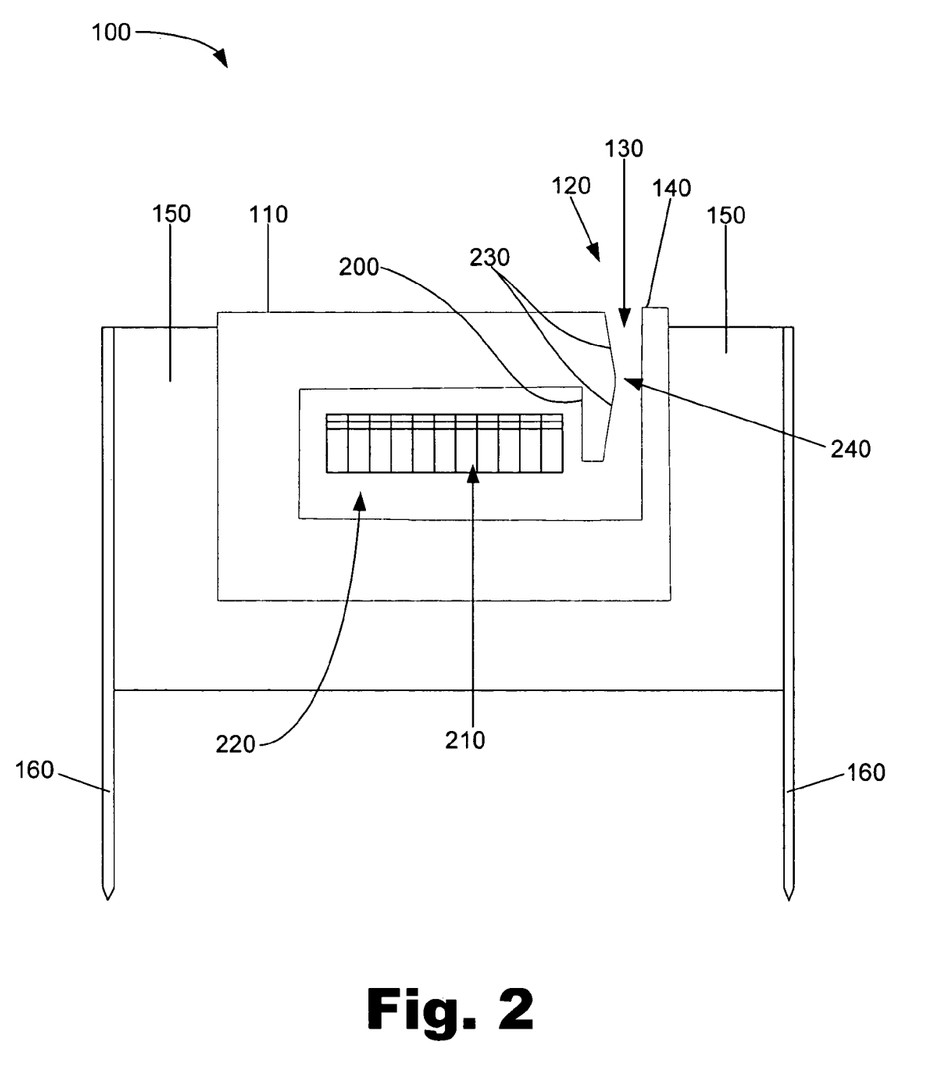
FIG. 2 is a cross-sectional view of a MEMS package according to one exemplary embodiment.

FIG. 1 illustrates a perspective view of a MEMS package. As shown in FIG. 1, the MEMS package (100) includes an inner enclosure (110) which surrounds a MEMS device or devices (210; FIG. 2). The inner enclosure (110) includes a fill port (120) having a fill port channel (130) and a surrounding pad (140). Moreover, the inner enclosure (110) is surrounded by an outer enclosure (150) and electrical coupling pins (160). As will be discussed in more detail below, the fill port channel (130) is of a sufficient length to allow an adhesive to be drawn therein to seal the MEMS package (100) while preventing the adhesive from entering the inner cavity and thereby contaminating the MEMS device. Accordingly, the configuration of the fill port channel (130) and its corresponding flow control features allow for a more robust MEMS package that accounts for and is less affected by process variations.

The inner enclosure (110) may be constructed out of silicon, silicon dioxide, glass, gold, or other suitable material. In the case of a silicon inner enclosure (110), one silicon wafer may be fused to another silicon wafer to form an inner cavity (220; FIG. 2). The inner cavity (220; FIG. 2) is configured to accommodate the MEMS device or devices. In any case, the inner enclosure (110) forms a substantially hermetic barrier around the MEMS devices in the inner enclosure (110) except for an open fill port (120) or fill ports. As described, the fill port (120) includes a fill port channel (130) and a surrounding pad (140) against the surface of which an adhesive seal is later applied.

An outer enclosure (150) may also be manufactured to surround a portion of the inner enclosure (110). The outer enclosure (150) may be formed of a ceramic, a plastic, or another material. Electrical connections made to MEMS devices inside the inner enclosure (110) extend through the inner enclosure (110) and the outer enclosure (150) to the outside of the package and will be referred to as electrical coupling pins (160). The electrical coupling pins (160) are illustrated as being laid out in a dual inline package (DIP) for conceptual simplicity, though they may exit the MEMS package in any of a number of configurations such as a bulk rate array or tape automated bonding (TAB), and later be used to allow electrical signals to enter and exit the MEMS. In an alternative MEMS package design, there may be no outer enclosure (150); rather, the MEMS device may be formed directly on a silicon wafer or other type of wafer.

FIG. 2 illustrates the fill port channel (130). The fill port channel (130) is the path between the flow control structure (200) and the surrounding pad (140). As will be discussed in more detail below, the flow control structure (200) increases the robustness of the MEMS package (100) to process variations.

The flow control structure (200) shown in FIG. 2 is a physical barrier or peninsula that physically separates a portion of the inner cavity (220) from the fill port channel (130). The flow control structure (200) is of sufficient length to contain an unanticipated quantity of adhesive drawn into the channel (130) during processing and keep that adhesive separate from the MEMS device (210). The internal physical separation allows a varying amount of fluid or adhesive to be drawn into the fill port channel (130) while physically separating the adhesive from the inner cavity (220). In other words, the fill port channel (130), which is separated from the inner cavity (220) by the flow control structure (200), allows filling fluid to be introduced to the inner cavity (220) and is of sufficient length to allow adhesive to be drawn therein for sealing purposes while preventing that adhesive from entering the inner cavity (220). As a result, the flow control structure (200) minimizes the possibility that process variations would result in a damaged MEMS assembly. For example, process variations may cause an unanticipated amount of adhesive to be drawn into the fill port channel (130).

The flow control structure (200) also includes locking features (230). The locking features (230) cause the fill port channel (130) to have a variable cross section. The locking features (230) shown in FIG. 2 are tapered sections formed on the flow control structure (200). The variable cross section of the locking features (230) creates a choke point (240) in the fill port channel (130) between the flow control structure (200) and the surrounding pad (140).

In operation, the locking features (230) lock an adhesive seal in place. Adhesive introduced to the fill port channel (130) is initially in a fluid or liquid state. Accordingly, the adhesive flows into the fill port channel (130) and past the choke point (240) a quantity of adhesive remains beyond the choke point as the adhesive cures. As the adhesive cures, it may thicken or solidify, thereby becoming less likely to flow back out of the fill port channel (130). As a result, the choke point secures or locks the cured or solidified adhesive in place and thereby minimizes the possibility that the adhesive seal will fail by becoming disengaged from the MEMS package (100).

Exemplary Implementation and Operation

As will be discussed in more detail below, an exemplary MEMS package is formed by placing a MEMS device (210) within the inner enclosure (110). The inner enclosure (210) is then filled with a packaging fluid. An adhesive is then placed in intimate contact with the packaging fluid. The adhesive is drawn into the fill port channel (130) by drawing the fluid, and thus the adhesive, into the fill port channel (130). Flow control features (200) control the flow of both the packaging fluid and the adhesive with respect to the inner enclosure. In addition, locking features (230) lock an adhesive seal formed by cured adhesive within the fill port channel (130), thereby creating a more robust seal.

Several exemplary MEMS packages will be discussed below. Some exemplary implementations include flow control structure and locking features that extend into the inner enclosure, while others include flow control structure exterior to the inner enclosure. In either case, the exemplary MEMS the flow control structure is of sufficient length to allow a quantity of adhesive to enter the fill port channel while preventing the adhesive from entering the inner cavity.

Figure 3:
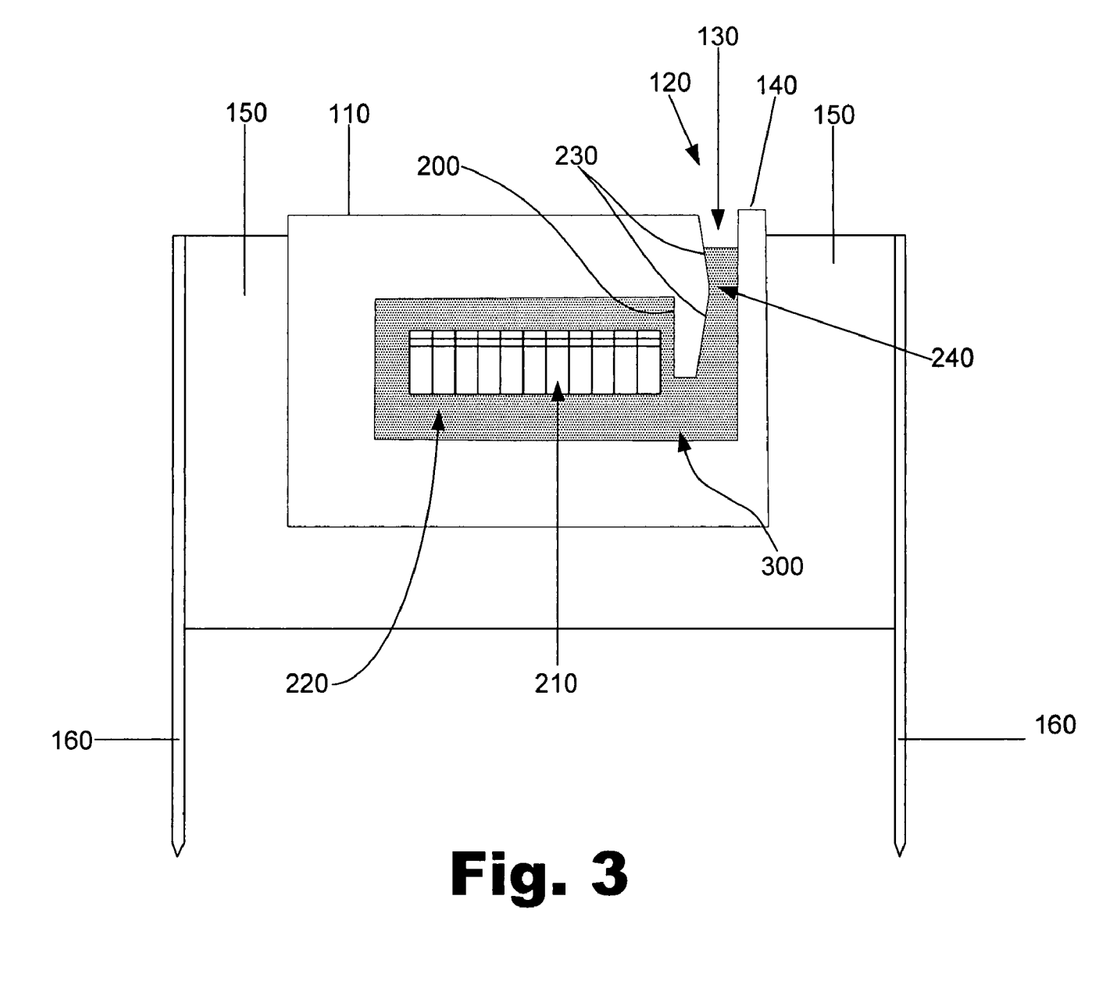
FIG. 3 is a cross-sectional view of a fluid filled MEMS package according to one exemplary embodiment.

FIG. 3 illustrates the MEMS device (210) surrounded by fluid (300). The fluid (300) is introduced to the inner enclosure (110) through the fill port channel (130). The fluid (300) flows through the fill port channel (130), past the flow control structure (200), and into the inner cavity (220).

As shown in FIG. 3, the fluid (300) surrounds the MEMS device (210). In addition to filling the inner cavity (220), the fluid (300) may extend into the fill port channel (130). The fluid (300) used to pack the MEMS device (210) may be any fluid that supports the operation of the MEMS device (210). For example, the fluid (300) may be a degassed packaging fluid configured to support the MEMS device (210) while reducing the likelihood of contamination. The fluid (300)

may be used to draw an adhesive into the fill port channel (130), as will be discussed in more detail below.

Figure 4:
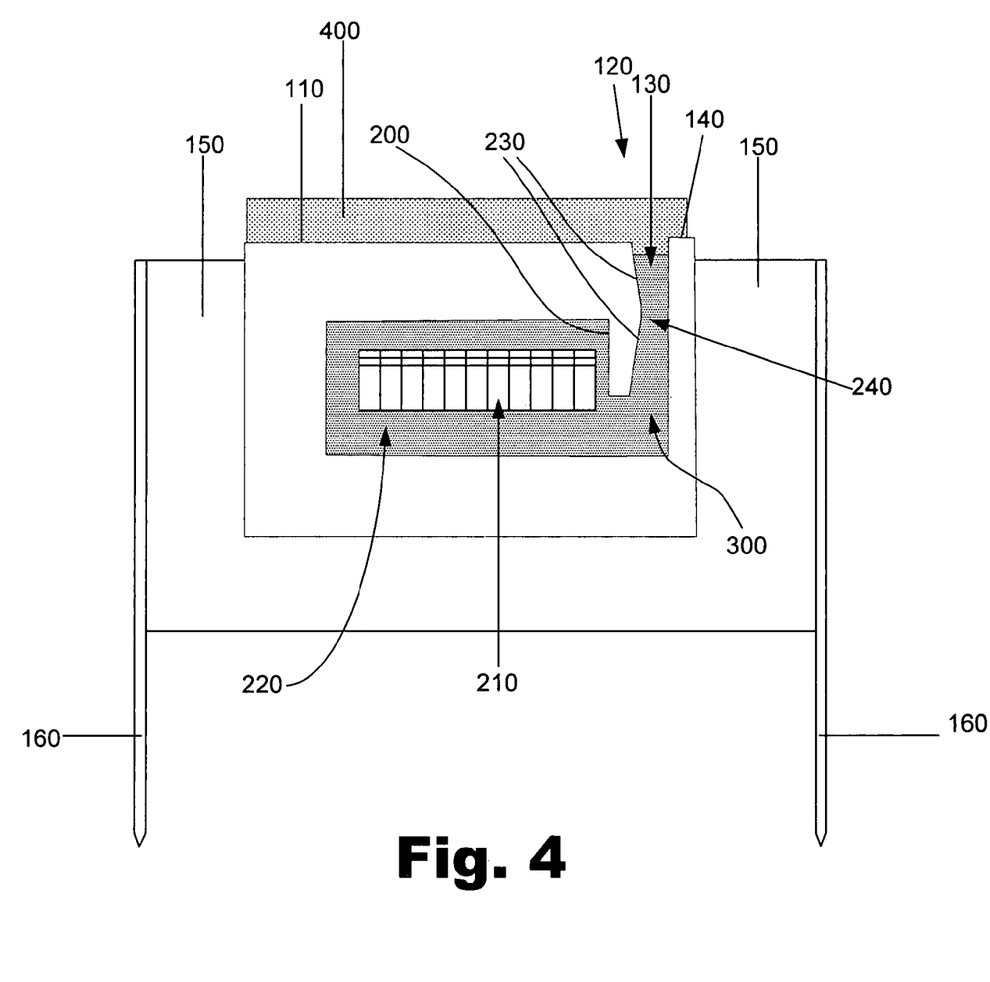
FIG. 4 is a cross-sectional view of a fluid filled MEMS package after application of an adhesive according to one exemplary embodiment.

FIG. 4 illustrates the inner enclosure (110) of a fluid filled MEMS package after an adhesive (400) has been applied as a seal. The adhesive (400) is applied in such a way as to fill a portion of the fill port channel (130). The adhesive (400) in the fill port channel (130) is placed in intimate contact with the packaging fluid (300). Further, the adhesive is applied without creating gas pockets between the packaging fluid (300) and the adhesive (400).

An airless interface between the packaging fluid (300) and the adhesive (400) reduces the likelihood of damage to the MEMS device (210). As will be discussed in more detail below, a change in the relative volume of the fluid (300) contained within the inner enclosure (110) draws the adhesive (400) into the fill port channel (130) before the adhesive (400) is cured. Because the adhesive (400) is a fluid during an initial stage, it is able to conform to variations in the fill port channel (130) geometry, thereby creating a seal. Examples of suitable adhesives include thermal plastic materials, UV and/or thermo-set epoxies, moisture/fluid cure adhesives, photo resist materials, and solder materials.

On the macro scale, surface tension is relatively weak. However, on the micro-scale, surface tension may be very strong and even dominate other typically strong forces. The surface tension between the fluid (300) and an adhesive may allow an adhesive to be partially drawn into the fill port channel (130). The flow control structure (200) is a physical barrier that allows a varying amount of adhesive to be drawn into the fill port channel (130) without being drawn into contact with the MEMS device (210).

In one exemplary method, the adhesive (400) is drawn into the fill portion either by changing the volume of the fluid or by changing the contained volume inside the MEMS device. The fluid volume may be change by changing the temperature of the fluid. For example, the inner enclosure (110) may be at 75 degrees Celsius when the adhesive (400) is applied to the fill port (120). After the adhesive covers the fill port (120), the temperature of the inner enclosure (110), including the fluid (300) contained therein, is reduced to 60 degrees Celsius. The temperature drop causes the fluid (300) to contract. The surface tension between the adhesive (400) and the fluid (300) causes the adhesive (400) to be drawn into the fill port channel (130) as the fluid contracts (300).

Figure 5:
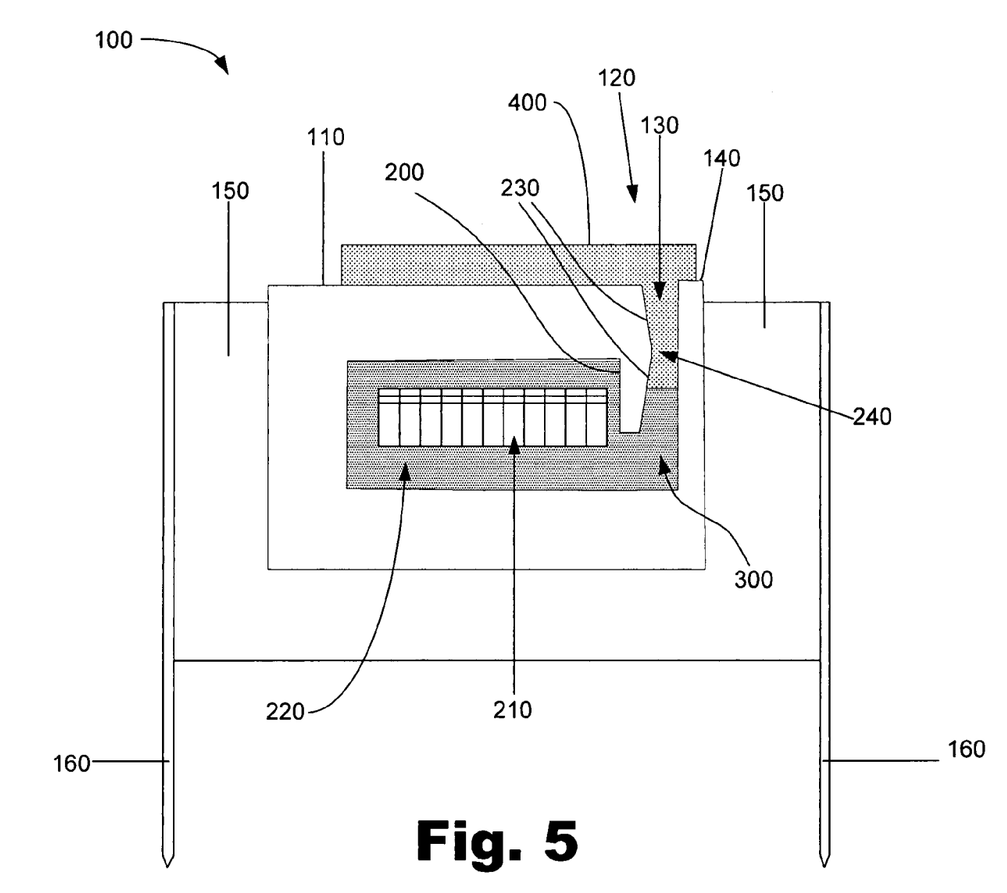
FIG. 5 is cross-sectional view of a sealed locked into the MEMS package according to one exemplary embodiment.

FIG. 5 illustrates an inner enclosure (110) where the adhesive (400) has been drawn into the fill port channel (130). The flow control structure (200) guides the flow of the adhesive (400) as it enters the fill port channel (130). In addition, the flow control structure (200) prevents the adhesive (400) from coming into contact with the MEMS device (210) by providing a physical barrier between the adhesive and the MEMS device. This physical barrier still allows the MEMS package to be filled with a fluid and properly sealed while protecting the MEMS device.

In addition, the flow control structure (200) is able to compensate for process variation. For example, several process variations can affect how much adhesive (400) is drawn into the fill port channel (130). These variations include temperature drift, time at temperature, and fluid properties. For example, if the temperature of the MEMS package were to drift below that intended to draw the adhesive (400) into the fill port channel (130) during an initial stage of a sealing operation, the resulting volumetric change of the packaging fluid (300) would cause more adhesive (400) to be drawn into the fill port channel (130) than intended. The flow control structure (200) allows a varying amount of adhesive to be contained in the fill port channel (130). As a result, the flow control structure (200) accommodates entry of the varying amounts of adhesive (400) while containing the adhesive (400) in the fill port channel (130) thereby preventing the adhesive (400) from contaminating the MEMS device. As discussed, the presence of the adhesive seal in the fill port channel (130) seals the MEMS package (100), thereby minimizing the possibility of subsequent contamination.

Figure 6:
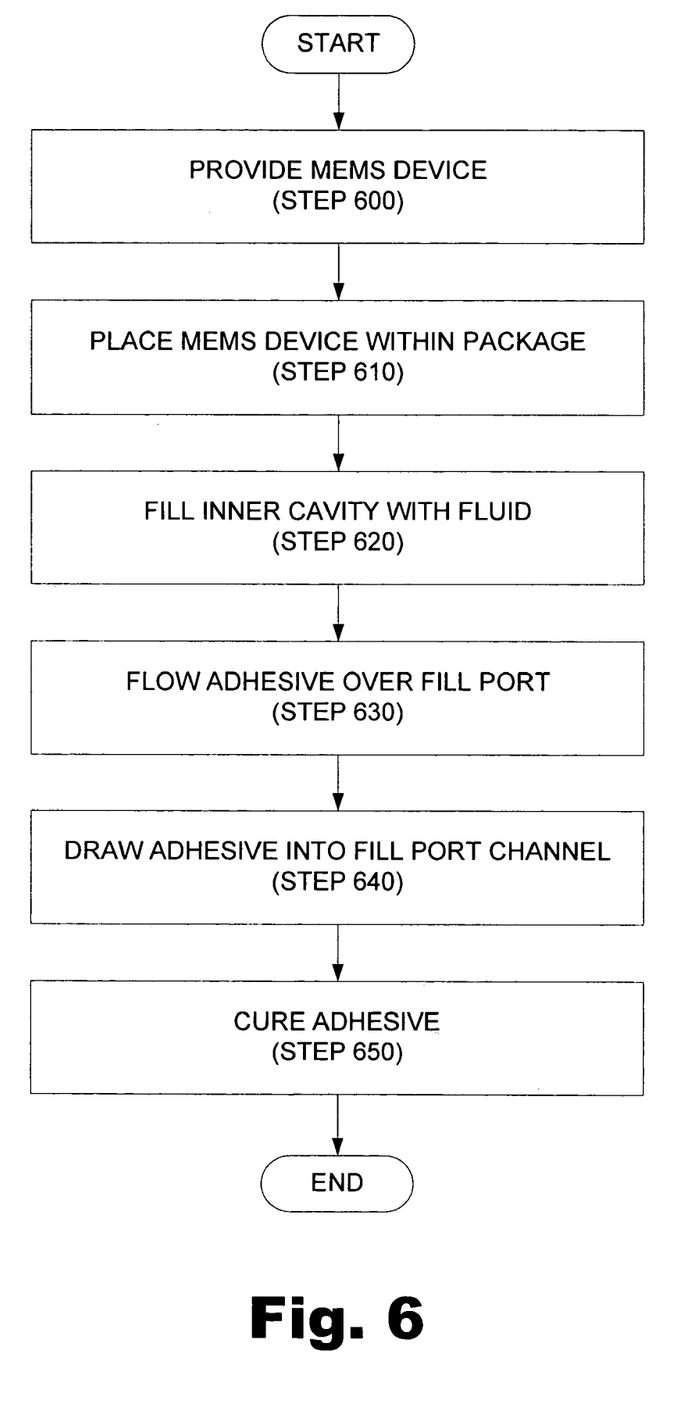
FIG. 6 is a flowchart illustrating a method of forming a MEMS package according to one exemplary embodiment.

FIG. 6 is a flowchart illustrating a method of sealing a MEMS package. The method begins by providing a MEMS device (step 600). The MEMS device is then placed within a MEMS package (step 610). More specifically, the MEMS device is placed within an inner cavity of an inner enclosure. The inner enclosure is a generally hollow cavity in communication with a fill port channel. The fill port channel further includes a flow control structure. The fill port channel provides a conduit by which fluid and/or adhesive may be introduced, as will be discussed in more detail below.

The flow control structure provides a physical barrier between the fill port channel and the MEMS device. The use of such a physical barrier increases the robustness of the MEMS package to process variations. In addition, the flow control structure minimizes the possibility that an adhesive will contaminate the MEMS device.

The flow control structure also includes locking features that create a choke point in the fill port channel. As will be discussed in more detail below, the choke point locks an adhesive seal in place, thereby further improving the robustness of a MEMS assembly having a MEMS device and packaging.

Once the MEMS device is placed within the inner enclosure (step 610), the inner cavity is filled with a packaging fluid (step 620). The packaging fluid is able to flow through the fill port channel and the locking feature to substantially fill the inner cavity of the inner enclosure. In addition to filling the inner cavity, the fluid may extend into the fill port channel and thus substantially fill all of the inner enclosure. The fluid used to pack the MEMS device may be any suitable fluid, such as a degassed fluid configured to support either the MEMS device while reducing the likelihood of contamination.

Adhesive is then applied over the flow port (step 630). Applying the adhesive over the flow port places the adhesive into intimate contact with the packaging fluid, which may be contained in the fill port channel. Accordingly, the adhesive may be placed in intimate contact with the packaging fluid before the adhesive is drawn into the fill port channel and past the locking features.

With the adhesive and packaging fluid in intimate contact, a quantity of adhesive is drawn into the fill port channel (step 640) in order to seal the inner enclosure. The adhesive may be drawn into the fill port channel either by changing the volume of the packing fluid or by changing the contained volume inside the MEMS device. The fluid volume may be change by changing the temperature of the fluid. For example, the inner enclosure may be at 75 degrees Celsius when the adhesive is applied to the fill port. After the adhesive covers the fill port, the temperature of the inner enclosure, including the fluid contained therein, is reduced to 60 degrees Celsius. The temperature drop causes the fluid (300) to contract, thereby drawing the adhesive into the fill port channel.

The adhesive, which is initially in a fluid state, flows into the fill port channel and past the flow control structure. As the adhesive cures (step 650), it becomes more viscous or even solidifies. After the adhesive cures, a portion of the adhesive remains in the fill port channel beyond the choke point. The choke point secures or locks the now cured or solidified adhesive in place. Locking the adhesive seal in place counters the shear stresses that would typically cause the adhesive seal to fail along its sides thereby minimizing the possibility that the adhesive seal will fail by becoming disengaged from the MEMS package.

ALTERNATIVE EMBODIMENTS

Figure 7:
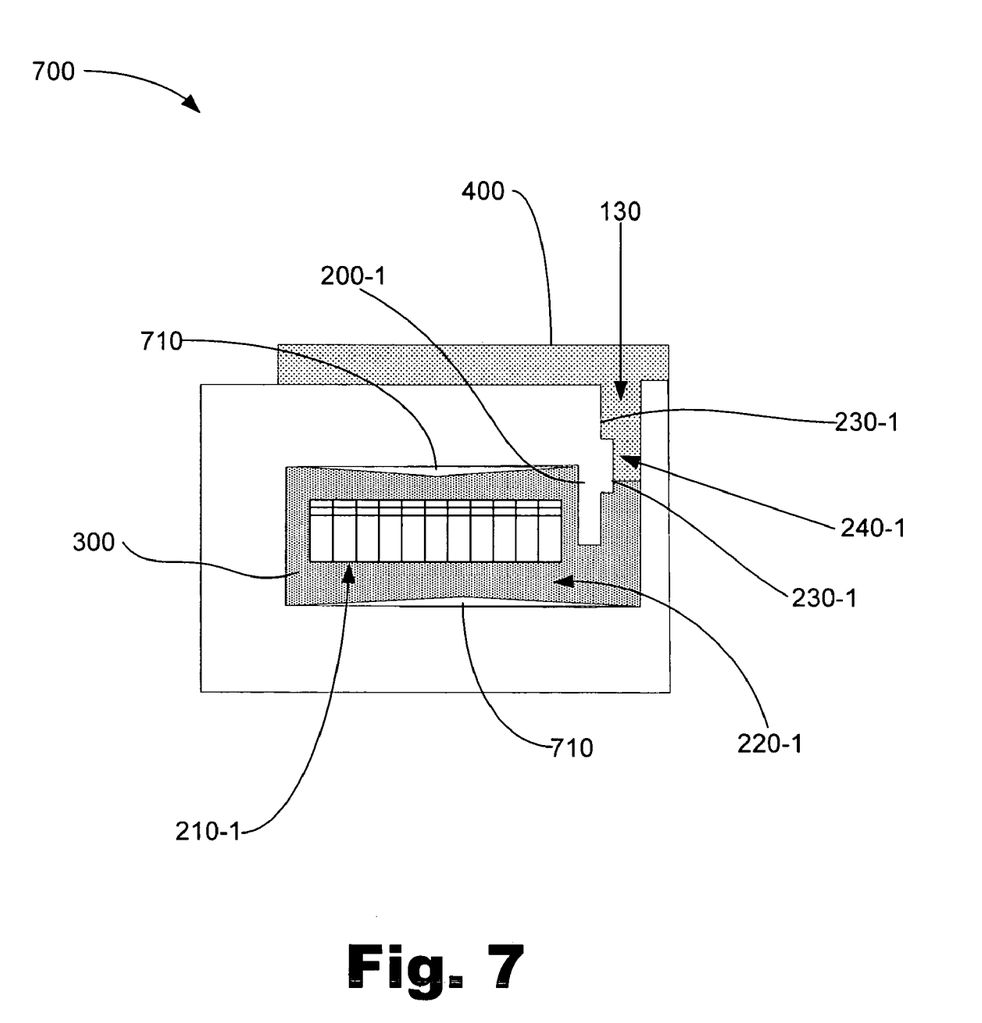
FIG. 7 is a cross-sectional view of a MEMS package according to one exemplary embodiment

In the embodiments discussed with reference to FIGS. 1-5, the flow control structure (200) includes tapered locking features (230). FIG. 7 illustrates an alternative MEMS assembly (700). The MEMS assembly (700) includes stepped locking features (230-1) formed on the flow control structure (200-1). The stepped locking features (230-1) form a choke point (240-1) within the fill port channel (130-1). As discussed above, the locking features (230-1) allow a fluid, such as a packaging fluid and/or a fluid adhesive to flow past the choke point. Once the adhesive has cured, it becomes more viscous or solidified. The nature of the cured adhesive locks the adhesive seal in place while it is prevented from contaminating the MEMS device (210-1) by the flow control structure (200-1). In addition, diaphragm members (710) may be placed within the inner cavity (220-1). The diaphragm members (710) are shown in the deformed shape. The diaphragm members (710) are configured to deform in response to a pressure decrease, and to return to their original shape as the pressure is increased. As a result, the adhesive (400) may be drawn into the fill port channel by depressurizing the fill fluid (300) before placing the adhesive (400) into intimate contact with the fill fluid (300). Once the pressure has been withdrawn, the diaphragm members (710) return to their original shape, thereby causing drawing the adhesive (400) into the fill port channel (130-1). Further, the diaphragm members (710) may be configured to compensate for an increase in volume of the filling fluid (300) due to thermal effects. The diaphragm members (710) may also deform in response to an increase in pressure, thereby compensating for thermal effects.

Figure 8:
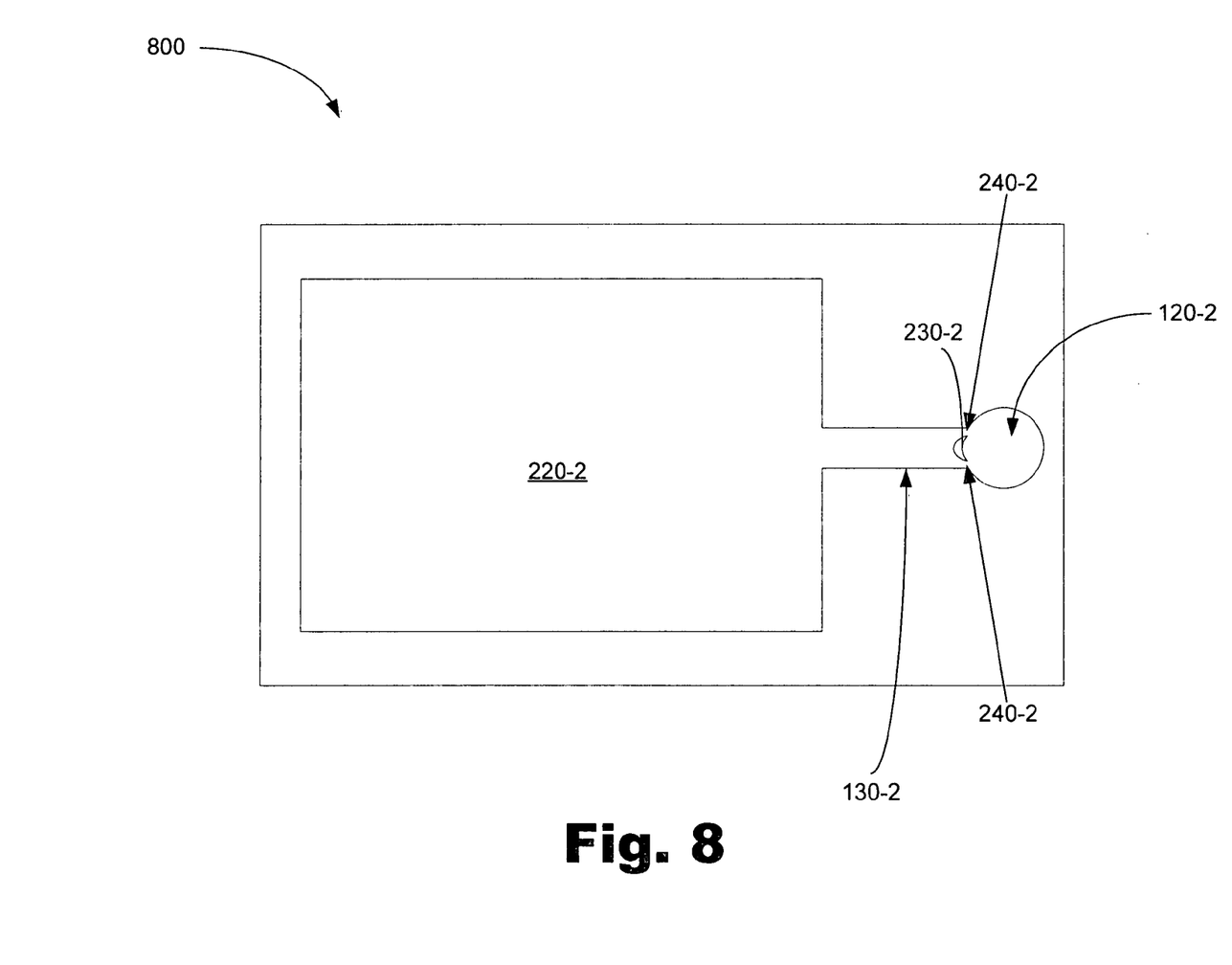
FIG. 8 illustrates a top view of a MEMS package according to one exemplary embodiment.

FIG. 8 illustrates a MEMS package (800) having a fill port channel (130-2) that is outside of the inner cavity (220-2). The fill port channel (130-2) includes a locking feature (230-2) such as island or delta that is located in the fill port channel (130-2), near the fill port (120-2) and between the fill port (120-2) and the inner cavity (220-2). The locking feature (230-2) forms choke points (240-2) between the edges of the locking feature (230-2) and the boundaries of the fill port channel (130-2). As previously described, the choke points allow fluid to enter the fill port channel (130-2). Fluid adhesive that is introduced to the fill port (120-2) is drawn into the fill port channel (130-2) as previously described.

The length of the fill port channel (130-2), and the external location of the fill port channel (130-2) with respect to the inner cavity (220-2) physically separates adhesive that enters the fill port channel (130-2) from the inner cavity (220-2). Accordingly, the external fill port channel (130-2) acts as a flow control feature because it physically separates adhesive that enters therein from reaching the inner cavity (220-2). The length of the fill port channel (130-2) accounts for process variations described above that cause a varying amount of adhesive to be drawn into the fill port channel. In other words, a variable amount of adhesive may be drawn into the fill port channel (130-2) and be contained therein without reaching the inner cavity due to the length of fill port channel (130-2). The adhesive may then be allowed to cure or solidify to seal the MEMS assembly (800).

Once the adhesive solidifies or begins to cure, the locking feature (230-2) minimizes the possibility that the sealing adhesive will become disengaged from the fill port channel (230-2). The locking feature (230-2) causes the fill port channel (230-2) to have a variable cross section. As described above the variable cross section of the fill port channel (230-2) due to the locking feature (230-2) results in two choke points (240-2) in the fill port channel (230-2). As previously discussed, the choke points (240-2) prevent the solidified adhesive seal from failing because the adhesive seal would have to be forced through the choke points (240-2).

Figure 9:
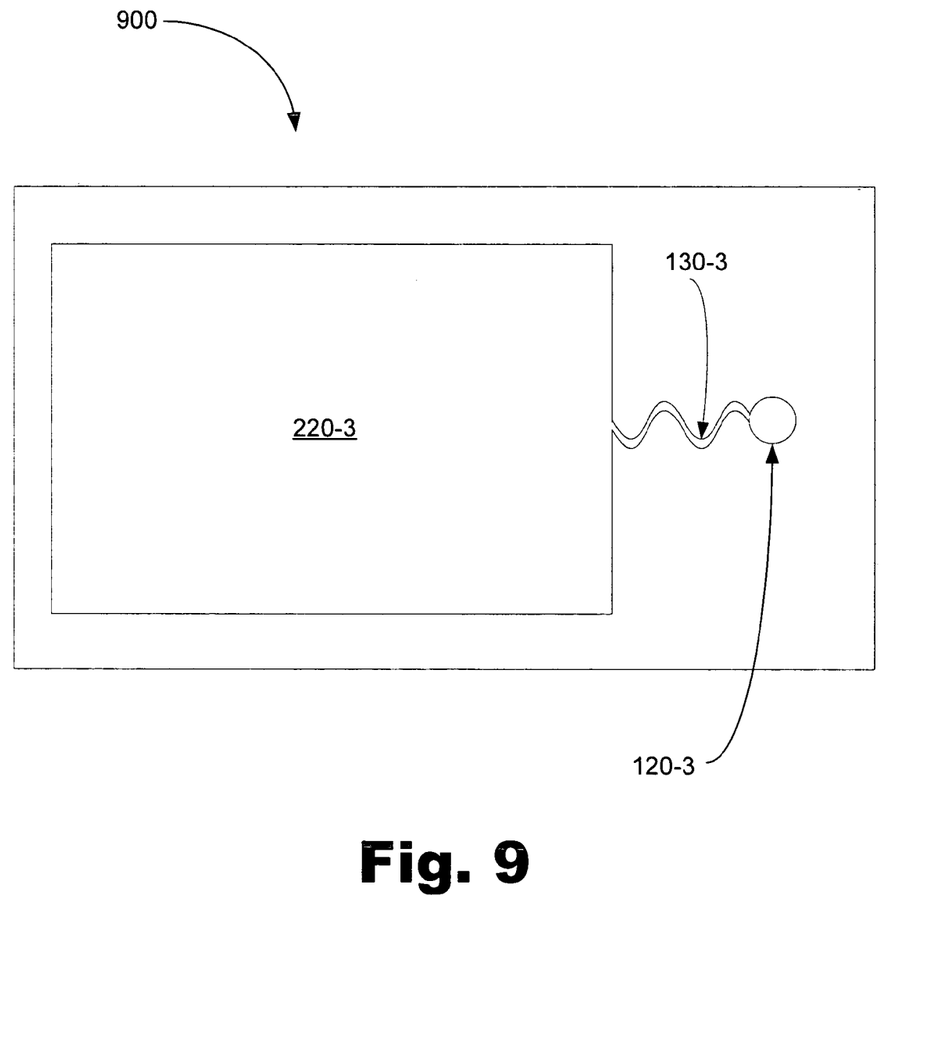
FIG. 9 illustrates a top view of a MEMS package according to one exemplary embodiment.

FIG. 9 illustrates a MEMS package (900) with a fill port channel (130-3) that is external to the inner cavity (220-3). The fill port channel (130-3) serves as a flow control structure and locking feature for fluid and/or adhesive that is introduced through the fill port (120-3). The fill port channel (130-3) is able to serve as both a flow control structure and as a locking feature because it follows a curvaceous or tortuous path. As a result, adhesive introduced to seal the MEMS assembly (900) is prevented from reaching the inner cavity (220-3). The increased length of the tortuous or curvaceous path allows a varying amount of adhesive to be contained in the fill port channel (130-3) without reaching the inner cavity (220-3).

In addition, the tortuous or curvaceous path of the fill port channel (130-3) locks an adhesive applied thereto in place. The tortuous path, while it may be of a substantially constant width, varies in direction. This variation in path direction corresponding to the curvaceous path prevents solidified adhesive from being withdrawn or pulled from the fill port channel (130-3). As a result, the fill port channel (130-3) that follows a serpentine path allows for process variation in drawing the adhesive therein and locks the adhesive into place once the adhesive has cured or solidified.

Figure 10:
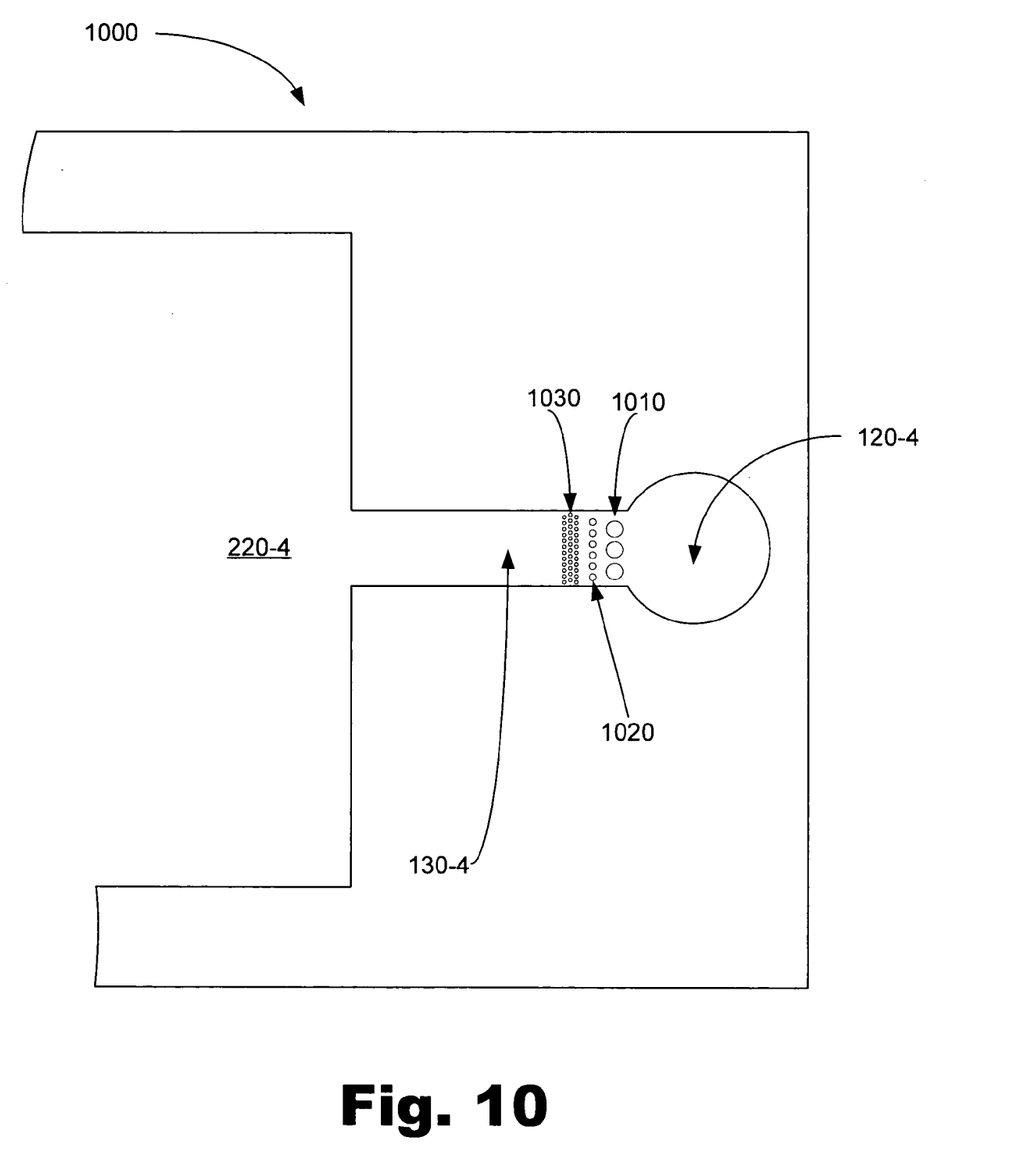
FIG. 10 illustrates a partial top view of a MEMS package according to one exemplary embodiment.

FIG. 10 illustrates a MEMS package (1000) in which first, second, and third locking feature groups (1010, 1020, 1030) are located within the fill port channel (130-4). As will be discussed in more detail below, the variable sizes of locking features associated with the locking feature groups (1010, 1020, 1030) provide a locking function with respect to the adhesive and also provides a filtering function with respect to fluid passing through the fill port channel (130-4).

The first, second and third locking feature groups (1010, 1020, 1030) are composed of varying sizes of locking features, such as the island locking features shown in FIG. 10. For example, the first locking feature group (1010) includes a plurality of locking features of a first or largest size. The second locking feature (1020) group includes a plurality of locking features of a second or intermediate size. The third locking group (1030) includes features of a third, or a smaller size. As a fluid enters the fill port (120-4) and passes through the fill port channel (130-4), it passes through gaps between the locking features. Because of the varying size of the locking features associated with the first, second and third locking feature groups, the fluid passes through gaps that become gradually smaller and smaller. As a result, contaminants that are larger in size than any one of the gaps between the locking features of the locking feature groups (1010, 1020, 1030) may be kept from entering the inner cavity (220-4).

In addition to preventing contaminants in a fluid from entering the inner cavity (220-4), the locking feature groups (1010, 1020, 1030) also lock an adhesive that enters the fill port channel (130-4), as previously discussed. As will be appreciated by those of skill in the art, any number of locking feature groups with any number of locking features of any suitable shape may be used. For example a single group of islands may be used as a locking feature. In addition, the locking feature groups may also be placed within a fill port channel that is internal to an inner enclosure, as shown in FIGS. 1-5.

In conclusion, the present apparatus provides a physical barrier between a fill port and a MEMS device. The physical barrier allows for a more robust process by providing a barrier to separate the MEMS device from excess adhesive that may be drawn into the fill port channel due to process variations. Further, the present apparatus provides locking features that improve the robustness of an applied adhesive seal. The locking features allow an inner enclosure to be filled with fluid while providing a choke point to minimize the possibility that the adhesive would be removed from the fill port channel.

The preceding description has been presented only to illustrate and describe exemplary embodiments of the present system and method. It is not intended to be exhaustive or to limit the system and method to any precise form disclosed. Many modifications and variations are possible in light of the above teaching. It is intended that the scope of the system and method be defined by the following claims.

What is claimed is:

1. A package for a micro-electromechanical device (MEMS package), comprising:
an inner enclosure having an inner cavity defined therein; and
a fill port channel communicating with said inner cavity through said inner enclosure;
wherein said fill port channel comprises a feature internal to said inner enclosure that permits passage of a fluid to said inner cavity, but restricts flow of an adhesive to allow a quantity of adhesive to enter said fill port channel while preventing said adhesive from entering said inner cavity, and wherein said fill port channel narrows gradually so as to taper to a choke point and then gradually widens approaching said inner cavity.

2. The MEMS package of claim 1, further comprising a peninsula that physically separates a portion of said inner cavity from said fill port channel.

3. A package for a micro-electromechanical device (MEMS device), comprising:
an inner enclosure having an inner cavity defined therein;
a fill port channel coupling said inner cavity to an atmosphere;
a peninsula in said inner cavity that physically separates a portion of said inner cavity from said fill port channel to control the flow of fluid into said inner cavity; and
locking features formed in said fill port channel internal to said inner enclosure, wherein said locking features comprise tapered sections that narrow gradually to a choke point and then gradually-widen approaching said inner cavity.

4. A micro-electromechanical (MEMS) assembly, comprising:
a MEMS device disposed at least partially within a package;
said package including an inner enclosure having an inner cavity defined therein, and a fill port channel coupling said inner cavity to an atmosphere and physically separating said atmosphere and said inner cavity by a distance sufficient to allow a variable flow of adhesive to enter said fill port channel while preventing said adhesive from entering said inner cavity;
an adhesive seal coupled to said fill port channel; and
a diaphragm disposed in said inner cavity for changing a volume of said inner cavity so as to draw a quantity of said adhesive seal through said fill port channel.

5. The assembly of claim 4, further comprising a fluid contained within said inner cavity.

6. The assembly of claim 5, wherein said fluid comprises a degassed packaging fluid.

7. The assembly of claim 4, wherein said adhesive is physically separated from said MEMS device by said flow control structure.

8. The assembly of claim 4, and further comprising locking features formed in said fill port channel and wherein said adhesive seal is locked in said fill port channel by said locking features.

9. The assembly of claim 4, wherein said adhesive seal comprises a photo resist material.

10. The assembly of claim 4, wherein said adhesive seal comprises a solder material.

11. The assembly of claim 4, wherein said adhesive comprises a thermo-set material.

12. The assembly of claim 4, wherein said adhesive comprises UV curable epoxy.

13. The assembly of claim 4, wherein said adhesive comprises thermoset epoxy.

14. The assembly of claim 4, wherein said adhesive comprises moisture/fluid cure adhesive.

15. A method of forming a package for a micro-electromechanical device (MEMS device), comprising:
forming an inner enclosure having an inner cavity defined therein;
forming a fill port channel, wherein said fill port channel extends through said inner enclosure so as to be in fluid communication with an atmosphere and said inner cavity and comprises a feature internal to said inner enclosure that permits passage of a fluid to said inner cavity and allows a variable flow of adhesive to enter said fill port channel while preventing said adhesive from entering said inner cavity;
forming a flow control structure to form said fill port channel and to physically separate said fill port channel from said inner cavity, said flow control structure including locking features formed thereon, wherein said locking features form at least one choke point at an intermediate portion of said fill port channel; and
flowing a quantity of said adhesive through a fill port of said fill port channel and into said fill port channel.

16. A micro-electromechanical system (MEMS) package, comprising:
means for containing a MEMS device;
a fluid with said MEMS device in said means for containing said MEMS device;
means for introducing said fluid into an interior cavity of said means for containing said MEMS device;
an adhesive flowed into said means for introducing said fluid; and
means for controlling a flow of said adhesive through said means for introducing said fluid to as to prevent said adhesive from entering said interior cavity; wherein said means for controlling said flow of said adhesive comprise sides of said means for introducing said fluid that narrow gradually so as to taper to a choke point and then gradually widen approaching said interior cavity.

17. The package of claim 16, further comprising means for locking said adhesive within said means for introducing said fluid.

18. The package of claim 17, wherein said means for locking said adhesive includes means for filtering said fluid.

19. A package for a micro-electromechanical device (MEMS package), comprising:
an inner enclosure having an inner cavity defined therein;
a fill port channel communicating with said inner cavity through said inner enclosure, wherein said fill port channel comprises a feature internal to said inner enclosure that permits passage of a fluid to said inner cavity, but restricts flow of an adhesive to allow a quantity of adhesive to enter said fill port channel while preventing said adhesive from entering said inner cavity; and a flow control structure extending at least partially into said fill port channel and wherein said flow control structure prevents said adhesive from entering said cavity by physically obstructing a portion of said fill port channel, wherein locking features are formed on said flow control structure, and wherein said locking features cause said fill port channel to have a variable cross section.

20. The MEMS package of claim 19, wherein said locking features comprise tapered sections formed on said flow control structure to form a choke point in said fill port channel.

21. A package for a micro-electromechanical device (MEMS package), comprising:

an inner enclosure having an inner cavity defined therein;

a fluid filling said inner enclosure;

a fill port channel communicating with said inner cavity through said inner enclosure;

wherein said fill port channel comprises a feature internal to said inner enclosure that permits passage of a fluid to said inner cavity, but restricts flow of an adhesive to allow a quantity of adhesive to enter said fill port channel while preventing said adhesive from entering said inner cavity; and at least one diaphragm disposed in said inner cavity for changing a volume of said inner cavity so as to draw a quantity of said adhesive through said fill port channel.

22. The MEMS package of claim 21, further comprising an airless interface between said fluid and said adhesive in said fill port channel.

23. A package for a micro-electromechanical device (MEMS device), comprising:

an inner enclosure having an inner cavity defined therein;

a fill port channel coupling said inner cavity to an atmosphere;

a peninsula in said inner cavity that physically separates a portion of said inner cavity from said fill port channel to control the flow of fluid into said inner cavity;

a fluid filling said inner enclosure;

an adhesive in said fill port channel to seal said fill port channel;

an airless interface between said fluid and said adhesive in said fill port channel; and at least one diaphragm disposed in said inner cavity for changing a volume of said inner cavity so as to draw a quantity of said adhesive through said fill port channel.

24. A package for a micro-electromechanical device (MEMS device), comprising:

an inner enclosure having an inner cavity defined therein;

a fill port channel coupling said inner cavity to an atmosphere, wherein said fill port channel narrows gradually so as to taper to a choke point and then gradually widens approaching said inner cavity; and a peninsula in said inner cavity that physically separates a portion of said inner cavity from said fill port channel to control the flow of fluid into said inner cavity.

25. A method of forming a package for a micro-electromechanical device (MEMS device), comprising:

forming an inner enclosure having an inner cavity defined therein;

forming a fill port channel, wherein said fill port channel extends through said inner enclosure so as to be in fluid communication with an atmosphere and said inner cavity and comprises a feature internal to said inner enclosure that permits passage of a fluid to said inner cavity and allows a variable flow of adhesive to enter said fill port channel while preventing said adhesive from entering said inner cavity;

forming a flow control structure to form said fill port channel and to physically separate said fill port channel from said inner cavity, said flow control structure including locking features formed thereon, wherein said locking features comprise a plurality of gradually tapered sections which form a choke point at an intermediate portion of said fill port channel; and flowing a quantity of said adhesive through a fill port of said fill port channel and into said fill port channel.

* * * * *

UNITED STATES PATENT AND TRADEMARK OFFICE
CERTIFICATE OF CORRECTION

PATENT NO. : 7,465,600 B2 Page 1 of 1
APPLICATION NO. : 10/775517
DATED : December 16, 2008
INVENTOR(S) : Don Michael et al.

It is certified that error appears in the above-identified patent and that said Letters Patent is hereby corrected as shown below:

In column 9, line 46, in Claim 3, delete "gradually-widen" and insert -- gradually widen --, therefor.

In column 10, line 50, in Claim 16, after "fluid" delete "to" and insert -- so --, therefor.

Signed and Sealed this

Fifth Day of May, 2009

JOHN DOLL
*Acting Director of the United States Patent and Trademark Office*